United States Patent [19]

Hamilton

[11] 4,079,334

[45] Mar. 14, 1978

[54] DIGITALLY CONTROLLED AMPLIFYING EQUIPMENT

[75] Inventor: Peter John Hamilton, London, England

[73] Assignee: Orange Musical Industries Limited, London, England

[21] Appl. No.: 722,672

[22] Filed: Sep. 13, 1976

[30] Foreign Application Priority Data

Sep. 11, 1975 United Kingdom ............... 37480/75

[51] Int. Cl.² ............................................. H03G 3/30
[52] U.S. Cl. ..................................... 330/279; 84/1.24; 84/DIG. 10; 330/86; 330/282
[58] Field of Search ............. 330/29, 86; 84/DIG. 10, 84/1.01, 1.24

[56] References Cited

U.S. PATENT DOCUMENTS

| 3,470,487 | 9/1969 | Lucas et al. | 330/86 |
| 3,659,031 | 4/1972 | Adachi | 84/DIG. 10 |
| 3,897,709 | 8/1975 | Hiyoshi et al. | 84/1.24 X |
| 3,974,436 | 8/1976 | Timpe | 330/86 X |

FOREIGN PATENT DOCUMENTS 2,116,076 10/1972 Germany ............................. 330/86

Primary Examiner—James B. Mullins
Attorney, Agent, or Firm—Wenderoth, Lind & Ponack

[57] ABSTRACT

A digitally controllable amplifier unit and musical instrument amplifier incorporating such a unit. Digital control of the transfer function of a high-gain virtual-earth amplifier is effected by switching input and feedback impedances by means of transistor switches. Digital storage means are used to control the transistor switches.

6 Claims, 9 Drawing Figures

| GAIN SETTING | a | b | c | d | AMP GAIN |
|---|---|---|---|---|---|
| 0 | 1 | 0 | 0 | 0 | ZERO |
| 1 | 1 | 0 | 0 | 1 | 0 dB |
| 2 | 1 | 0 | 1 | 0 | 6 dB |
| 3 | 1 | 1 | 0 | 0 | 12 dB |
| 4 | 0 | 0 | 0 | 1 | 18 dB |
| 5 | 0 | 0 | 1 | 0 | 24 dB |
| 6 | 0 | 1 | 0 | 0 | 30 dB |

DIGITALLY CONTROLLED AMPLIFYING EQUIPMENT

The invention relates to digitally controlled amplifying equipment and has particular application in audio amplifiers and systems embodying such amplifiers. Audio amplifiers generally have controls which may be set manually to adjust volume and tone. Some amplifiers, particularly musical instrument amplifiers, have facilities for adjusting other functions, such as "reverberation," "sustain," "wah-wah" and "fuzz."

In a musical instrument amplifier it is desirable to be able to switch, during playing, between different sound responses. To this end, different sound channels may be set up having different responses and the channels may be selected at will during playing to convey the sound. This means that a large number of manual controls must be provided — one for each function in each channel. The present invention seeks to provide an improved adjustable audio amplifier unit and instrument amplifier equipment embodying such as audio amplifier unit.

According to one aspect of the invention there is provided a digitally controllable amplifier unit comprising a high-gain virtual-earth amplifier having a feedback impedance arrangement and parallel input impedances, transistor switches connected to the input impedances and/or the feedback impedance arrangement, and input terminals connected to trigger electrodes of the transistors, the transfer function of the amplifier unit being adjusted by selectively switching the transistor switches on and off. With this arrangement the transfer function of the amplifier unit can be changed incrementally by applying a parallel digital input to the input terminals so as to switch in certain combinations of impedances. In use, a digital storage means is connected to the input terminals and the output from the storage means is set to hold the transfer function at a required level.

While impedances such as capacitors, inductors and, for example, diodes may be employed to give certain complex transfer characteristics, a simple and preferred embodiment of the invention uses resistors as the input and feedback impedances, so that the transfer function is linear and control is effective to alter the gain.

The transistor switches may be discrete transistors or integrated circuit devices. In a preferred embodiment the transistor switches are CMOS bidirectional analogue switch devices. Preferably, both the feedback resistor arrangement and the input resistors have transistor switches. In a preferred arrangement the values of the input resistors and, where provided, the switchable feedback resistors, are such that by switching the transistor switches in turn a changing gain can be achieved which is in exponential steps. Steps of 6 dB are suitable for many applications particularly for the control of volume. However, for more exacting applications a larger number of smaller incremental step — perhaps of about 1 bB might be more suitable.

Control of the resistors may be by series connection of the resistors with respective transistor switches so that when the switch is open the resistor is out of circuit. Alternatively, the resistors may be connected in parallel with their respective transistor switches so that when the switches are closed the resistors are short-circuited.

In accordance with another aspect of the invention there is provided a digitally controlled instrument amplifier comprising at least one digitally controlled amplifier unit, a store comprising a plurality of digital registers representing respective channels, programming means for digitally programming the registers, the amplifier unit and the store being interconnected so that the digital control of the amplifier unit is effected in accordance with the digital information contained in an enabled register of the store, and a channel selector means for selecting a channel and thereby enabling a selected one of the registers to control the amplifier.

The controlled amplifier units are preferably, although not necessarily, of the kind described above.

The effect of controlling the amplifier unit or units is to alter their transfer characteristics. The functions being controlled by the amplifier unit may be the audio volume and such gain control in series in the audio path is effective for this purpose. However, the function to be controlled may be reverberation, "sustain" of distortion for example.

Effects such as reverberation can be achieved with the use of a linear digitally controlled amplifier having resistoric inputs and feedback. Such an amplifier may, for example, follow a reverberation unit in a path which is auxiliary to the main audio path, the outputs of the two paths being combined. Other effects, such as distortion ("fuzz") and compression ("sustain") can advantageously be achieved with the use of impedances other than resistors in the input and/or feedback paths of the amplifier. Such impedances can be switched electronically to alter the transfer function of the amplifier as required.

For tone control the audio path is split into two or three or more parallel sub-paths, each of which has a respective pass band filter followed by a respective controlled amplifier unit. The outputs of the amplifier units are summed and by adjusting their relative gains the tone of the signal can be controlled.

Single-function control for different channels has limited application and preferably more than one function is controllable and there is a set of amplifier units for the control of each function. With this arrangement a function control selector is required and although this may be a manual selector it is preferred to select function by means of the keyboard. Each amplifier has a plurality of programmable digital storage means according to the number of channels, storage means of an amplifier being associated with a respective channel. Channel selection is effective to switch the storage means into operation in channel groups.

Preferably the programming means comprises a keyboard, channel selector means for selecting the channel to be programmed, and function selector means for selecting the function to be programmed and means for applying the keyboard output through the channel and function selector means to set the level of the selected storage means.

The invention will further be described with reference to the accompanying drawings, of which.

Figure 1:
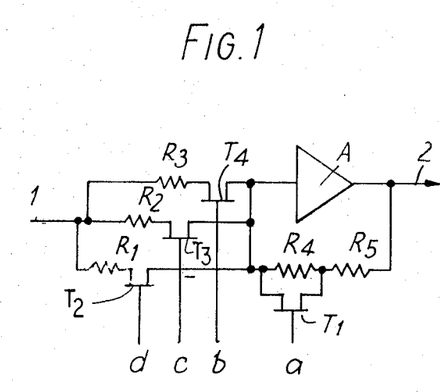
FIG. 1 is a circuit diagram of an amplifier unit in accordance with the invention.

Referring to FIG. 1 the amplifier unit comprises a high-grain virtual-earth amplifier A having a resistive feedback chain consisting of series resistors R4 and R5. Resistor R4 has a field effect transistor T1 connected across it. The gate input terminal of transistor T1 is indicated at a. The amplifier has input resistors R1, R2 and R3 connected in parallel and in series with each is a respective field effect transistor T2, T3 and T4 having respective gate electrodes d, c and b. The input to the amplifier unit is applied at 1 and the output is taken from 2.

The amplifier unit is designed to effect incremental gain changes in steps of 6 dB.

Figure 2:
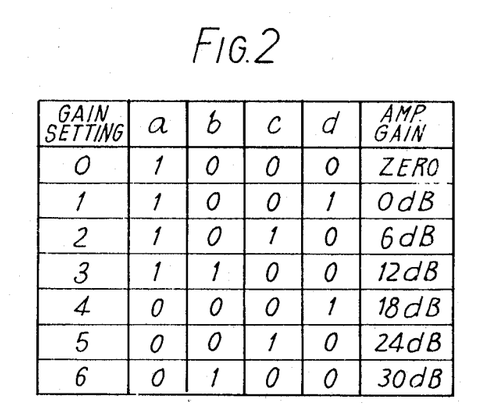
FIG. 2 is a truth table for the operation of the amplifier unit of FIG. 1.

To this end, the ratio of resistors R1:R2:R3 is 1:½:¼. Also (R4 + R5):R5 = 8:1. Thus, by selectively switching on one of the transistors T2, T3 or T4 at any one time and, in addition selectively switching on transistor T1, the gain of the amplifier unit can be controlled in 6dB steps. The truth table of FIG. 2 represents the gain settings available by the application of digital binary inputs to to the gate electrodes of the transistors. A "1" indicates that the respective transistor is on.

FIGS. 3, 4a–4d and 5a and 5b show circuit arrangements for use with an instrument amplifier. In this application it is required to preset a number of alternative channels in the amplifiers with predetermined sound characteristics which may be selected during playing to give a controlled output sound which may be varied from time to time. The arrangement is that a digital keyboard is used to pre-program the channels by sequential selections of channel and function and then keying the required level for the function in the particular channel. Subsequently, while playing through the amplifier the keyboard (or another digital device) can be used to select the channel required to be operative at any particular time. In the particular embodiment to be described there are four channels having seven functions.

Figure 3:
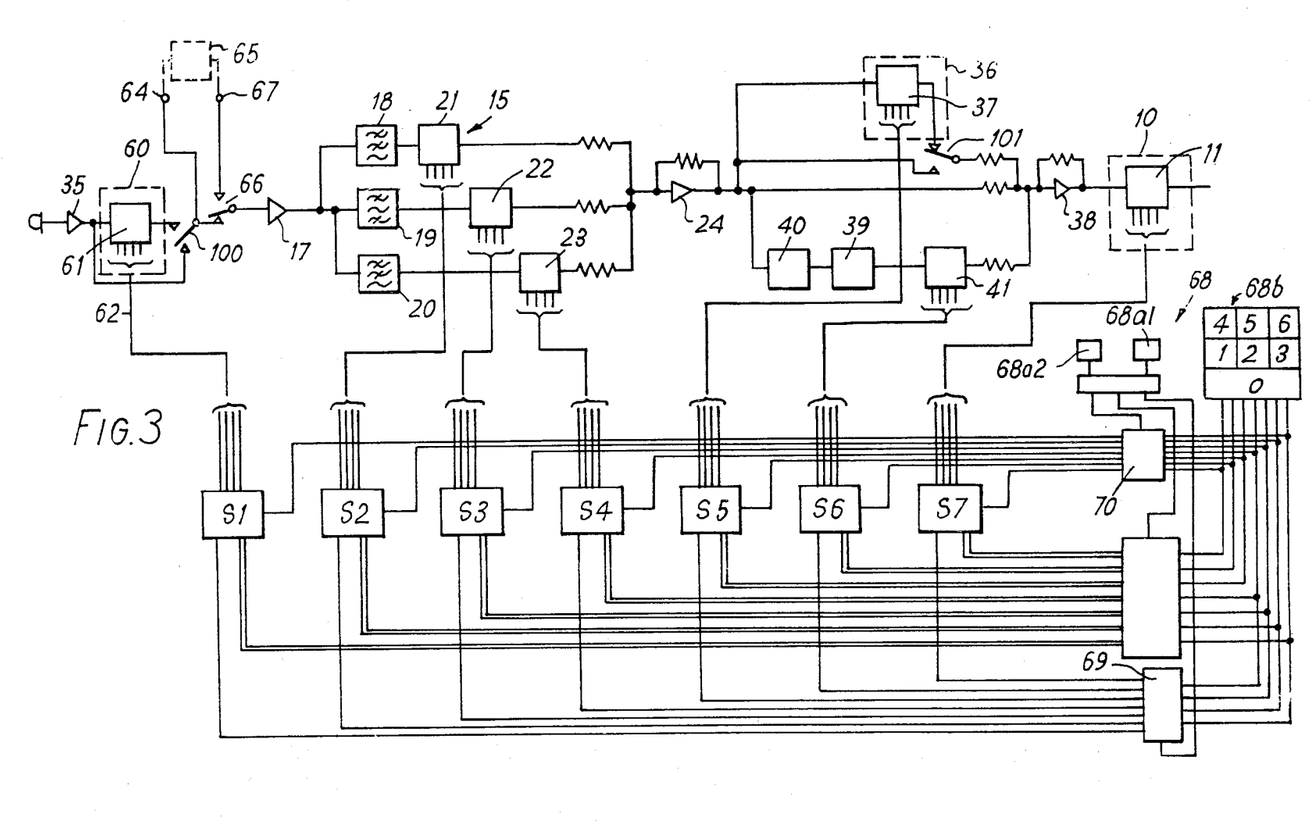
FIG. 3 is a block diagram of the analogue circuitry of an instrument amplifier embodying the invention.
Figure 4A:
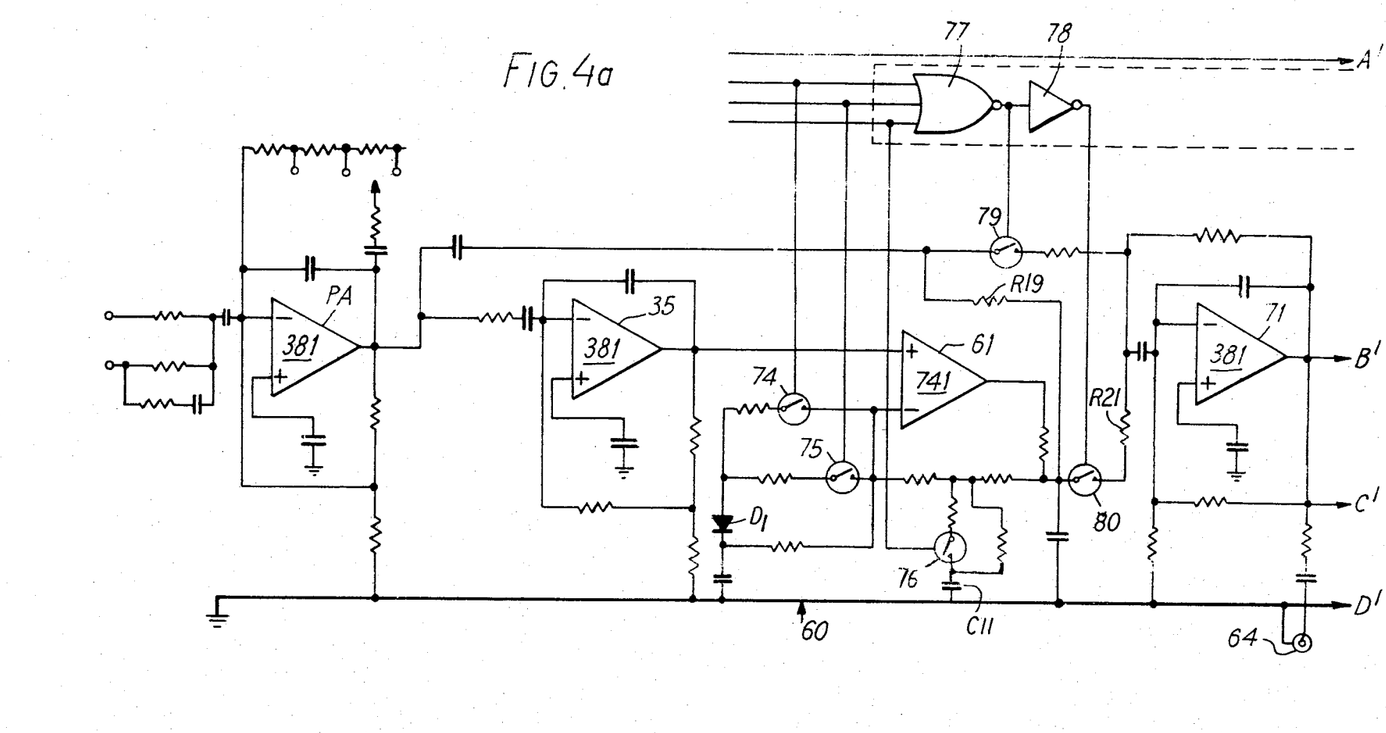
FIGS. 4a–4d together constitute a circuit diagram of the analogue circuitry of an instrument amplifier of FIG. 3.
Figure 4B:
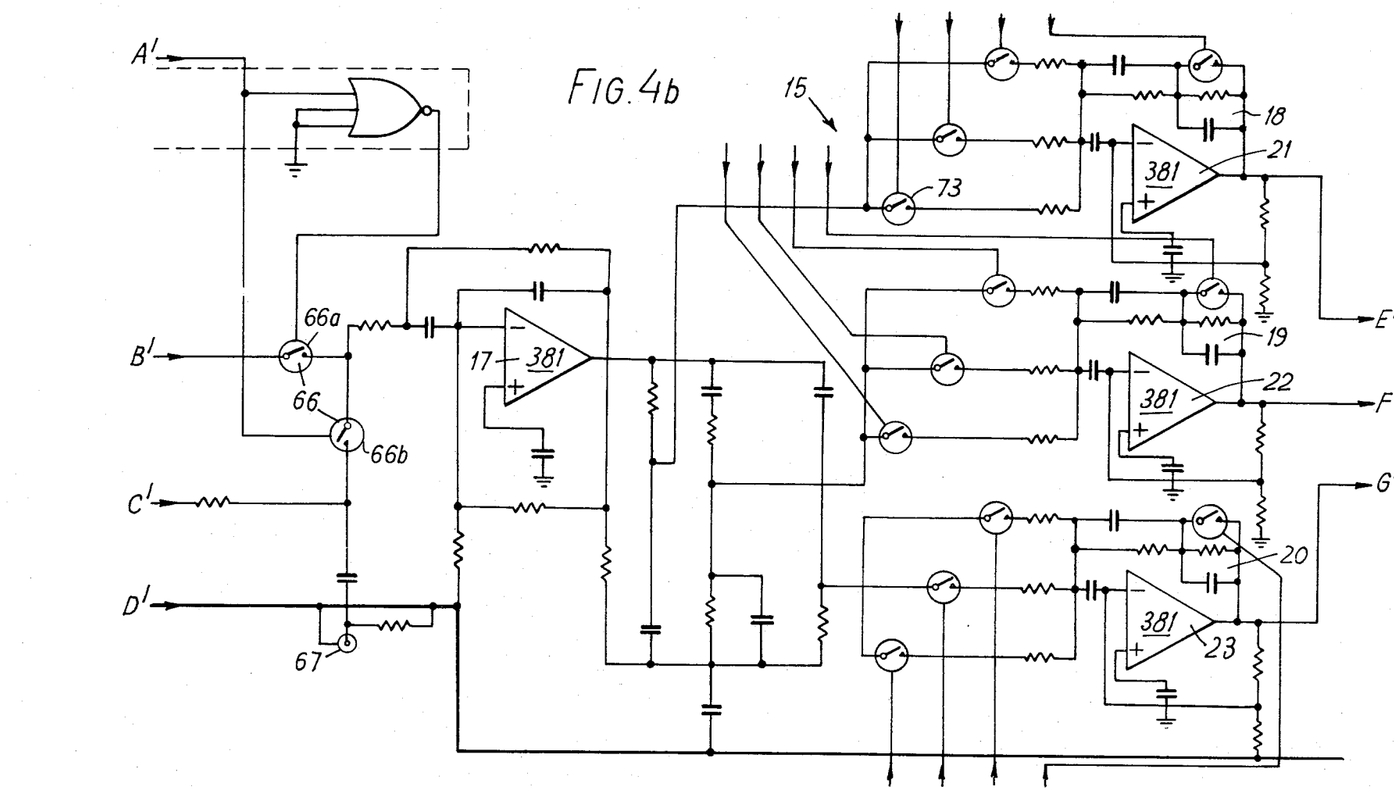
Figure 4C:
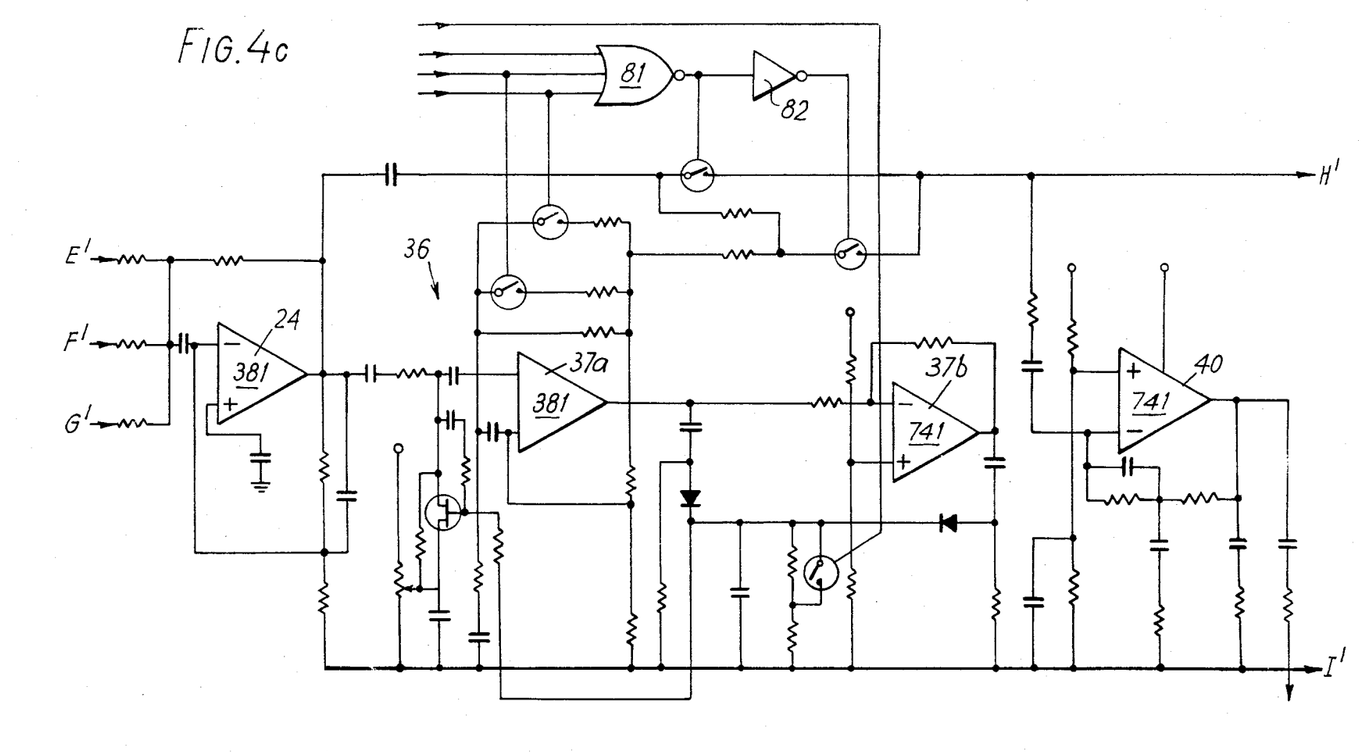
Figure 4D:
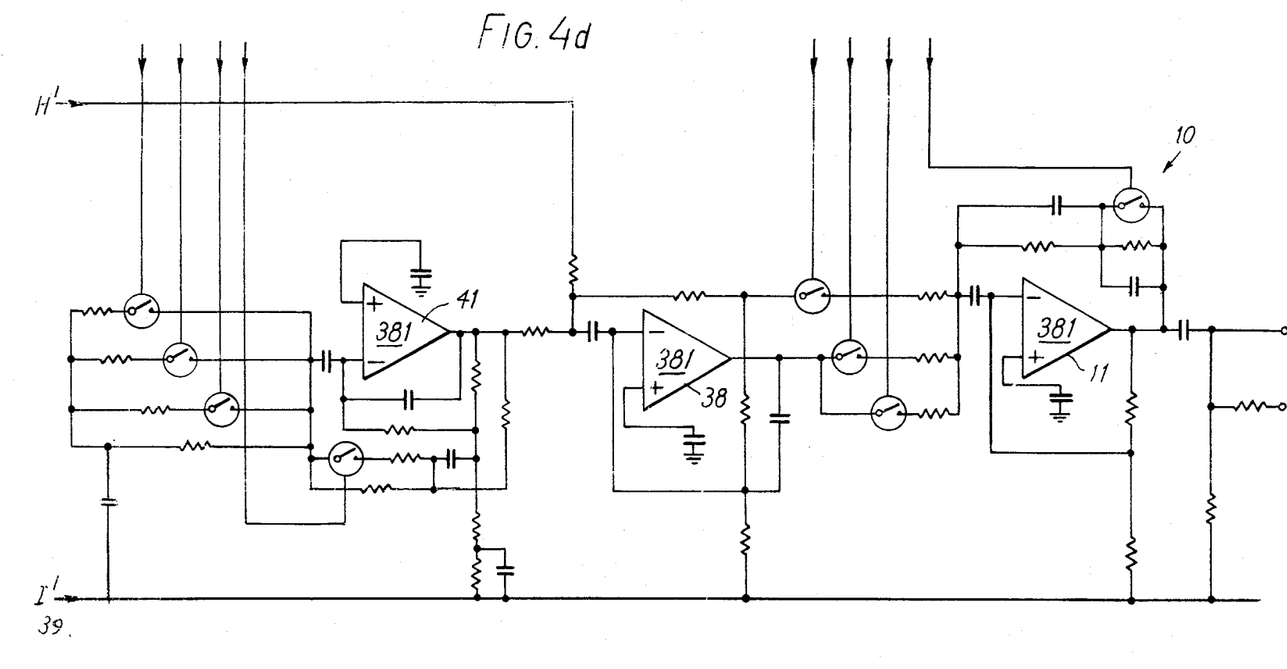

FIG. 3 shows the audio circuit schematically. An input is applied through an input amplifier 35 to a distortion control unit 60 which includes a digitally controllable amplifier 61 having switched input and feedback impedances essentially as described in FIG. 1 except the impedances are not all resistors. The amplifier has four control inputs corresponding to inputs a–d of FIG. 1 and shown grouped in a line 62 connected to a 4 × 4 digital storage means 51. Digital setting of the amplifier inputs from the storage means controls the degree of distortion imparted by unit 60. The distortion unit is switched in series with the audio path by an electronically controlled switch 100 as required. The output from the switch 100 is applied to an output terminal 64 to which can be connected externally an optional effects device 65 to introduce any further desired effect. A remotely controlled switch 66 is capable of removing from circuit the device 65, the output terminal of which is shown at 67, or including the device 65 in series in the audio path.

Switch 66 feeds a tone control circuit 15. This comprises an input amplifier 17 which feeds a parallel combination of low-pass filter 18, middle-pass filter 19, and high-pass filter 20. The filters are followed by digitally controlled amplifiers 21, 22 and 23 respectively. The outputs from the sub-channels including the band-pass filters and amplifiers are summed in a summing amplifier 24. It will be seen that adjustment of the gain of amplifiers 21–23 affects the relative amplitude of the three sections of the audio spectrum and thereby adjusts the tone of the channel. Amplifiers 21, 22, and 23 are of the kind described with reference to FIG. 1. The four-bit parallel inputs are held in respective stores S2, S3 and S4. After the tone control unit there is a compressor unit 36 which has the effect of sustaining a tone applied to it. The unit 36 includes an amplifier 37 which is similar to the amplifier of FIG. 1 and is digitally controlled. The control information for amplifier 37 is stored in a storage means S5. By adjusting the gain of amplifier 37 digitally, compression threshold, and thus the "sustain" effect is controlled.

The compressed unit is switched into circuit by a switch 101 when required. The output from the switch 101 is fed to a summing amplifier and also to a spring reverberation unit 39 after passing through a driver amplifier 40. The reverberation unit is followed by a further digitally controlled amplifier 41 which is identical with the amplifier of FIG. 1. The control information for amplifier 41 is stored in a store S6. Adjustment of the gain of amplifier 41 allows an adjustable reverberation effect to be added to the sound, the output from amplifier 41 being applied to the summing amplifier 38.

Finally, the audio path includes a volume control amplifier unit 10 which includes a digitally controlled amplifier unit 11 of the kind shown in FIG. 1. The four binary control inputs for amplifier 11 are devised from 4 × 4 digital storage means S7.

It will be seen that there are seven digitally controlled amplifiers which control respective functions of the audio path, namely distortion, bass, middle and treble tones, sustain, reverberation and volume. Each of the amplifiers is capable of being set to any one of six levels and for each amplifier four available levels can be preset in the storage means for immediate selection. The levels of the storage means are selected in groups by the channel selection.

Channel, function and level selections are controlled by a keyboard of push-buttons 68. There are two illuminated buttons designated "channel select" button 68a1 and "function select" button 68a2 respectively. Additionally, there is a set 68b of seven buttons carrying the numerals 0 – 6 for level selection and the names of the seven functions for function selection.

Depression of the appropriate "channel select" button 68a1 applies the output of the set buttons 68b to a channel encoder 69 which is connected to the storage means S1 to S7. When the required channel is then selected by pushing one of the buttons 1 to 4 of the set 68b, all the storage means are set to operate on the appropriate one of their four registers, each register being of four bits.

Next, the "function select" button 68a2 is depressed and this applies the outputs of the set of buttons 68b, to a function encoder 70 which is connected to enabling inputs of storage means S1 to S7. When the required function is selected by depressing the appropriate push-button 68b one and only one of the storage means will be enabled. Then the circuit charges state automatically to a "set level" condition when a "set level" indicator lamp is illuminated. At this time the binary coded outputs of the buttons 68b are connected to the digital inputs of the storage means. Depression of the appropriate button 68b to select level will then apply that level information to all the storage means. However, only the enabled storage means will respond to store the level in the appropriate register.

In this way all the storage means can have stored in sequence the required levels in each of their four registers. Thus, four channels of different level combinations for the different functions can be set up. During playing, all that is necessary to change the character to the sound is to select another channel by means of the "channel select" button 68a1. The selected channel at any time is indicated by a seven-segment numerical display (not shown).

Referring now to FIGS. 4a–4d, there is shown a complete circuit diagram corresponding to the block diagram of FIG. 3 The same reference numerals are used in both Figures and FIGS. 4a–4d will therefore be understandable having regard to the previous description. However, some minor points deserve explanation. Firstly, the amplifiers shown in FIGS. 4a–4d carry type designations 381 and 741 as appropriate. Also there are shown some additional amplifiers, namely a preamplifier 70 and a buffer effects amplifier 71.

It will be seen that the transistor switches as shown for example at 73 are not conventional transistors as described with reference to FIG. 1 but are CMOS bidirectional analogue switches of the type 4016.

The distortion circuit 60 operates with only three binary level inputs from storage means S1 instead of four. This reduces the number of steps of distortion available. The fourth output from storage means S1 is used to control the switch 66 which is constituted by a pair of CMOS switches 66a and 66b. Reverting to the distortion amplifier 61 it will be seen that two of the binary inputs are applied to switch switches 74 and 75 at the input of amplifier 61, one of the inputs switches a switch 76 in the feedback path of the amplifier, and further signals are derived from an NOR gate 77 and an invertor 78 to control switches 79 and 80 which switch the distortion unit into circuit if a "1" is present at any of the control inputs. Thus, selected degrees of distortion are achieved by altering the relative effects of diodes D1, capacitors C10 and C11 and resistors R19 and R21.

A similar arrangement of NOR gate 81 and invertor 82 is provided for switching into circuit the sustain amplifier arrangement 37a, 37b. Here, the open-loop gain of the compressor amplifier is altered, thereby altering the compression threshold and the subjective degree of sustain.

Figure 5A:
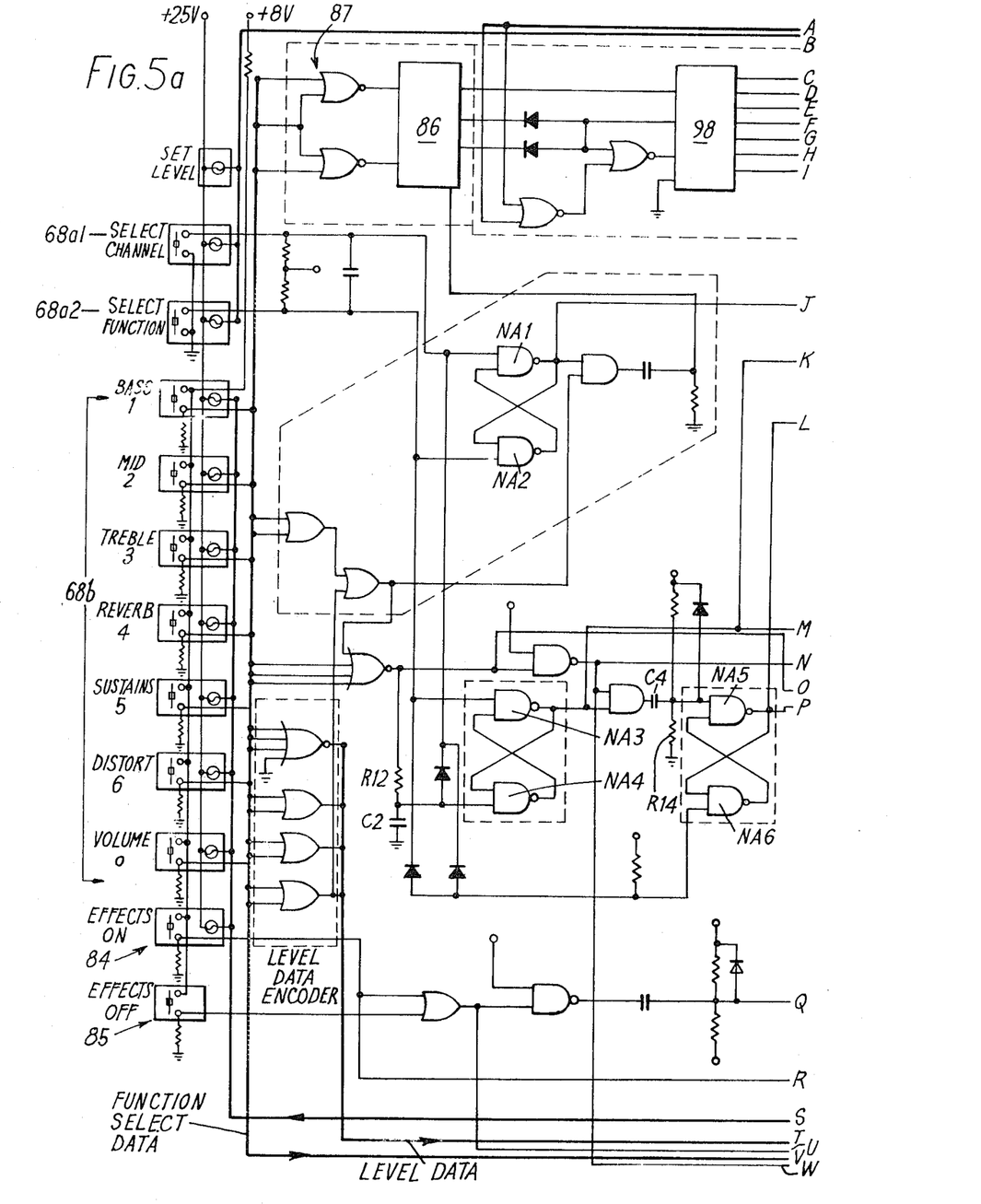
FIG. 5a and 5b together constitute a circuit diagram of the digital control circuitry of the instrument amplifier of FIG. 3 and the parts of FIG. 4.
Figure 5B:
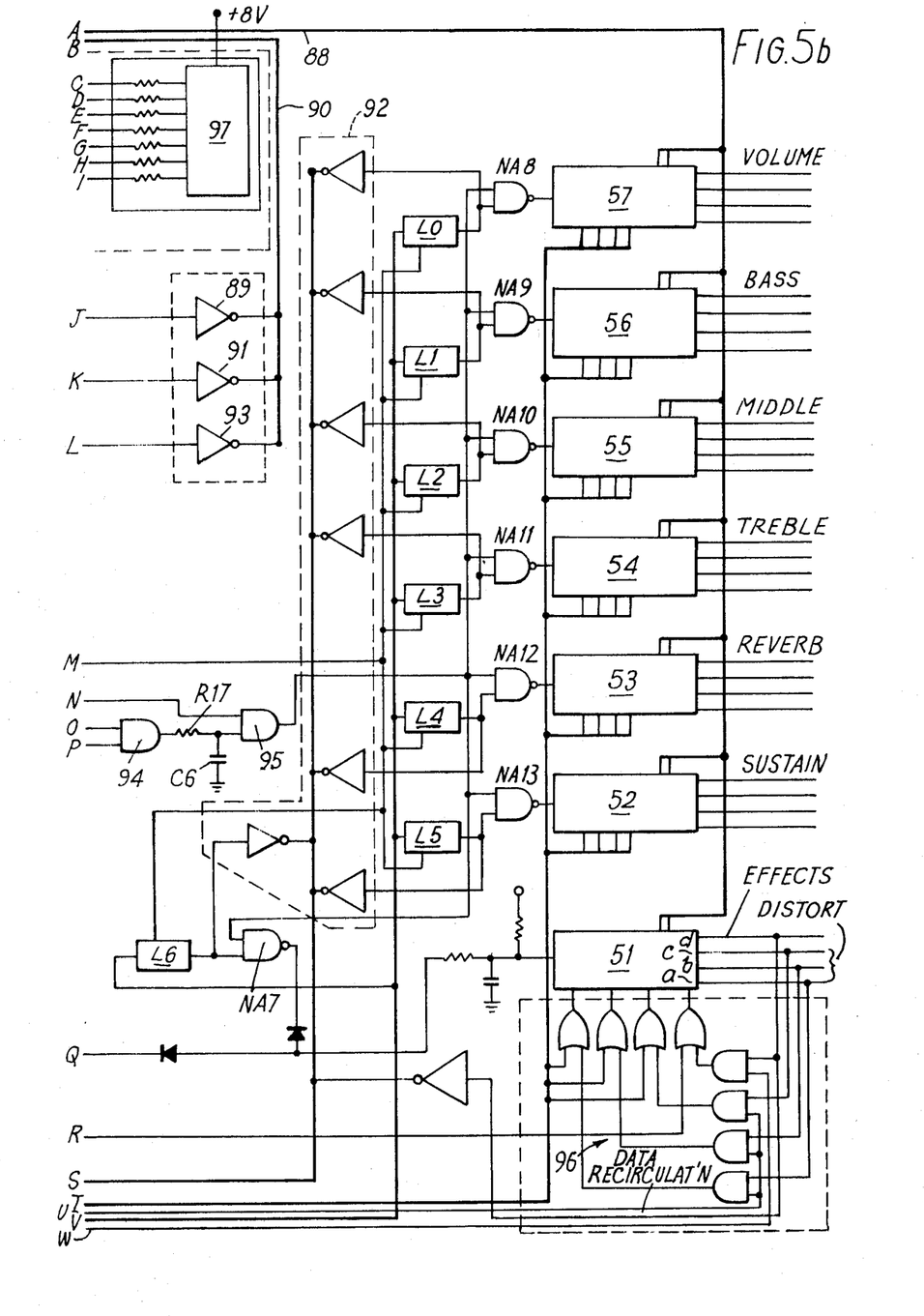

Referring now to FIGS. 5a and 5b there is shown the logic circuit for controlling the circuit of FIG. 4. The "set-level" indicator lamp push button 84 and the pushbuttons 68a1, 68a2 and 68b are shown at the left of the drawing. Additionally, there is an "effects on" and and "effects off" push-button 85 for switching the additional effects facility as desired.

Depression of the "select channel" button sets a bistable circuit NA1/NA2 which permits a channel data latch 86 to be enabled on depression of one of the buttons 1 to 4. The input is encoded by an encoder 87 and the relevant channel data is applied to the storage means S1 to S7 by way of a line 88. The bistable circuit also illuminates the "select channel" button via a lamp driver 89 and line 90.

On depression of the "select function" button, the bistable circuit NA1/NA2 is reset and a bistable circuit NA3/NA4 is set, enabling latches L0–L6 and illuminated the select function button via a lamp driver 91.

Depression of any numerical/function button applies a high level voltage to the input of the corresponding latch and after a few milliseconds (determined by R12, C2) resets the bistable circuit, disabling the latch and thus storing a high level signal in the latch. The button pressed is illuminated by a respective lamp driver of the group 92.

At the same time, a bistable circuit NA5/NA6 is set by a pulse through capacitor C4, illuminated the "set level" indicator via driver 93. When the button is released the output of gate 94 goes high, charging capacitor C6 through R17. The front panel now displays the selected function and "set level."

When a subsequent button is depressed to set the level a pulse appears at the output of a gate 95 and is transferred through the appropriate gate NA7–NA13 to enable the respective storage means S1 to S7 briefly. Simultaneously the level data corresponding to the numerical button is applied to all the storage means and is thus transferred to the enabled register of the respective storage means.

Storage means S1 has some associated circuitry concerned with the external effects facility. One bit per channel (d) of the storage means carries the effect in/-out information; the other three bits are devoted to the three distortion settings. Data recirculation circuitry 96 enables the storage means to retain its distortion setting when the effects information is charged and vice-versa.

The seven-segment channel indicator mentioned above is shown at 97, being driven by a decoding circuit 98 from the output of the channel data latch 86.

The invention is not restricted to the details of the foregoing description made with reference to the drawings. For example, the memory units described are of a kind which is cleared when the supply voltage is removed. Thus, the voltage must be maintained after programming. It is proposed that instead of such an arrangement a non-volatile (permanent) memory may be used. While still being programmable, such a memory is not erased by withdrawl of supply voltage.

Furthermore, a remote control unit such as an ultrasonic unit may be employed for coupling the keyboard to the remainder to the circuitry. An auxiliary input for channel selection is envisaged whereby a remote switch, for example an illuminated foot-switch, may be connected by cable to control channel selection during playing.

I claim:

1. A digitally controllable instrument amplifier comprising at least one digitally controllable amplifier unit, a storage means comprising a plurality of digital registers representing respective audio channels, digital programming means connected to the registers for effecting digital programming thereof, the amplifier unit and the storage means being interconnected for effecting digital control of the amplifier unit in accordance with the digital information in an enabled register of the storage means, and a channel selector means connected to the storage means for selecting a channel and thereby enabling a second one of the registers to control the amplifier unit.

2. A digitally controllable instrument amplifier as claimed in claim 1 wherein there is at least one further digitally controllable amplifier unit and a corresponding storage means having a plurality of registers for selectively controlling the amplifier unit in the same manner as the first above-described amplifier unit, the amplifier units being connected in the same audio channel of the instrument amplifier for effecting different controllable functions in the audio response of the instrument amplifier, the said channel selection means being connected for selecting corresponding channels simultaneously in the amplifier units.

3. A digitally controllable instrument amplifier as claimed in claim 1 wherein the digitally controllable amplifier unit comprises a high-grain virtual-earth amplifier including a feedback impedance arrangement and parallel input impedances, transistor switches connected to the amplifier unit, and input terminals connected to trigger electrodes of the transistors, the transfer function of the amplifier unit being adjusted by selectively switching the transistor switches on and off.

4. A digitally controllable instrument amplifier unit as claimed in claim 1 including a set of digital push-buttons including numerical push-buttons connected to the channel selector means and the storage means for presetting a selected register of a selected storage means with the digital information for controlling the respective amplifier unit by depression of the appropriate numerical push-buttons in sequence.

5. A digitally controllable instrument amplifier as claimed in claim 4 wherein the channel selector means includes a "select channel" push-button and a "select function" push-button; at least some of the numerical push-buttons having respective function insignia thereon; and further comprising an address circuit responsive to depression of the "select channel" push-button for directing subsequent numerical information from the numerical push-buttons to enable only the registers of the storage means appropriate to the selected channel, and then being responsive to the depression of the "select function" push-button and subsequent depression of a function-designated numerical push-button for enabling only one storage means corresponding to the selected function to receive digital information, whereby level information indicated by subsequent depression of a selected numerical push-button can then be fed to the selected register of the selected storage means by the address circuit.

6. A digitally controllable instrument amplifier as claimed in claim 5 wherein there are four selectable channels and seven selectable functions.

* * * * *